United States Patent [19]

Castello et al.

[11] Patent Number: 5,430,337
[45] Date of Patent: Jul. 4, 1995

[54] TRANSCONDUCTOR STAGE

[75] Inventors: Rinaldo Castello, Arcore; Roberto Alini, Stradella; Francesco Rezzi, Vescovato; Valerio Pisati, Bosnasco, all of Italy

[73] Assignee: SGS-Thomson Microelectronics, S.r.l., Agrate Brianza, Italy

[21] Appl. No.: 105,736

[22] Filed: Aug. 12, 1993

[30] Foreign Application Priority Data

Aug. 26, 1992 [EP] European Pat. Off. ........... 92830456

[51] Int. Cl.⁶ .................. H03K 17/60; G06G 7/12
[52] U.S. Cl. .................... 327/65; 327/103; 327/432
[58] Field of Search ............ 307/490, 494, 495, 499, 307/570; 330/252, 253, 277, 299

[56] References Cited

U.S. PATENT DOCUMENTS

| | | | |
|---|---|---|---|
| 4,823,092 | 4/1989 | Pennock | 330/253 |
| 5,012,137 | 4/1991 | Muellner | 307/570 |
| 5,095,284 | 3/1992 | Mead | |
| 5,101,126 | 3/1992 | Butler et al. | 307/570 |
| 5,304,869 | 4/1994 | Greason | 307/495 |
| 5,311,088 | 5/1994 | Nelson | 307/494 |

FOREIGN PATENT DOCUMENTS

453034A1 4/1991 European Pat. Off.
2175763 5/1986 United Kingdom.

OTHER PUBLICATIONS

Warren, et al., "Noise, Crosstalk and Distortion In Mixed Analog/Digital Integrated Circuits", Proceedings of the IEEE 1988 Custom Integrated Circuits Conference, May 1988, pp. 1211–1214.

Primary Examiner—Timothy P. Callahan
Assistant Examiner—Toan Tran

[57] ABSTRACT

A transconductor stage for high-frequency filters of a type which comprises an input circuit portion having signal inputs and an output circuit portion, incorporates a pair of field-effect transistors having respective gate and source terminals in common, and has the output portion formed of a pair of bipolar transistors connected to the aforesaid field-effect transistors.

27 Claims, 2 Drawing Sheets

TRANSCONDUCTOR STAGE

CROSS-REFERENCE TO RELATED APPLICATION

This application claims priority from EPC App'n 92830456.7, filed Aug. 26, 1992, which is hereby incorporated by reference.

BACKGROUND AND SUMMARY OF THE INVENTION

This invention relates to an improved integrated circuit transconductance stage, and to filters employing such transconductance stages.

The field of this invention is related to monolithically integrated continuous-time filters, but it is not exclusively limited to this field. Reference will be made in the description to the field of monolithically integrated continuous-time filters merely for convenience of illustration.

Many continuous-time integrated filter making techniques have been proposed, and implemented. One of the most promising techniques for high-frequency performance is the class which employ a transconductor stage as the filter base block.

This is true because the voltage/current conversion takes place in open loop within the transconductor. This means that the converter is not limited by the unity gain in frequency of the amplification.

The performance characteristics which are usually expected of a transconductor stage for high-frequency applications are basically the following ones:

a capability to handle a wide bandwidth of signals;
low noise production at output and to the source;
low bias current;
a high transconductance $g_m$ value; and
a gain higher than 50 dB.

Previous to the invention disclosed here, a transconductor stage embodiment which has good performance characteristics approaching the above specifications is disclosed in Italian Patent Application No. MI91A 003018 of SGS-Thomson. (Corresponding U.S. application Ser. No. 07/942,678, filed Sep. 9, 1992, is hereby incorporated by reference.)

The transconductance amplifier is described in the above mentioned application is made in mixed Bipolar/MOS technology and contains an input circuit with a differential cell having two MOS transistors with their sources tied together. This is connected to an output circuit which contains a pair of bipolar transistors having their bases tied together.

Although the above mentioned application has many advantages, it has the disadvantage that high transconductance values cannot be obtained. This means that there is a difficulty is achieving low current drain and good linearity.

Another related transconductance stage is described in the article "MOS Tunable Transconductor" (Electronics Letters, 19th Jun. 1986, Vol. 22, No. 13), which is hereby incorporated by reference. In the article a transconductor is suggested whose input stage has a pair of buffer-connected MOS transistors associated with two more MOS transistors forming the gain stage.

In all of these types of amplifiers, the first two MOS transistors are responsible for most of the distortion.

The other transistor pair have their substrates connected to ground and are, therefore, affected by an unfavorable "Body Effect". Accordingly, their threshold voltage is raised by some 0.5 Volts and narrows the overdrive value (Vgs–Vth) range that can be applied to the transistors for programming the transconductance gm value. The latter known solution has, moreover, a disadvantage in that it can only operate at a supply voltage of about ten volts.

According to innovative teachings disclosed herein, there is provided: An integrated circuit transconductor stage, comprising: first and second circuit branches, each including a bipolar transistor and a field-effect transistor in series, the bipolar transistors having bases thereof connected to provide complementary inputs for the transconductor, and the field-effect transistors having gates thereof connected together; and a bias circuit connected to provide a constant bias voltage to the gates, the bias voltage having a value which keeps the field-effect transistors operating in a substantially ohmic regime.

According to innovative teachings disclosed herein, there is provided: An integrated circuit, comprising: first and second circuit branches, each including a bipolar transistor and a field-effect transistor in series, the bipolar transistors having bases thereof connected to provide complementary inputs for the transconductor, the field-effect transistors having gates thereof connected together, and the field-effect transistors having sources thereof connected together; bias circuitry connected to provide a constant bias voltage to the gates, the bias voltage having a value which keeps the field-effect transistors operating in a substantially ohmic regime; a first current source connected to provide a substantially constant current to the sources; and a load connected to provide two current outputs with equal source impedances, opposite in polarity to the first bias current, separately to the bipolar transistors.

According to innovative teachings disclosed herein, there is provided: An integrated circuit, comprising: first and second circuit branches, each including a bipolar transistor and a field-effect transistor in series, the bipolar transistors having bases thereof connected to provide complementary inputs for the transconductor and connected to be driven by equal bias currents, the field-effect transistors having gates thereof connected together, and the field-effect transistors having sources thereof connected together; and bias circuitry connected to provide a constant bias voltage to the gates, the bias voltage having a value which keeps the field-effect transistors operating in a substantially ohmic regime; a first current source connected to provide a substantially constant first bias current to the sources; a load connected to provide two current outputs with equal source impedances, opposite in polarity to the first bias current, separately to the bipolar transistors.

According to innovative teachings disclosed herein, there is provided: A transconductor stage for high-frequency filters, comprising an input circuit portion having signal inputs, and an output circuit portion, and a pair of field-effect transistors having respective gate and source terminals in common, wherein the output portion comprises a pair of bipolar transistors connected to the field-effect transistors.

According to innovative teachings disclosed herein, there is provided: A transconductor stage for high-frequency filters of a type which comprises an input circuit portion having signal inputs and an output circuit portion, incorporates a pair of field-effect transistors having respective gate and source terminals in common, and has the output portion formed of a pair of bipolar transistors connected to the field-effect transistors.

This invention solves the technical problems listed above. Furthermore, it has other advantages that are illustrated throughout this disclosure.

BRIEF DESCRIPTION OF THE DRAWINGS

The present invention will be described with reference to the accompanying drawings, which show important sample embodiments of the invention and which are incorporated in the specification hereof by reference, wherein.

DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Figures 1, 2:
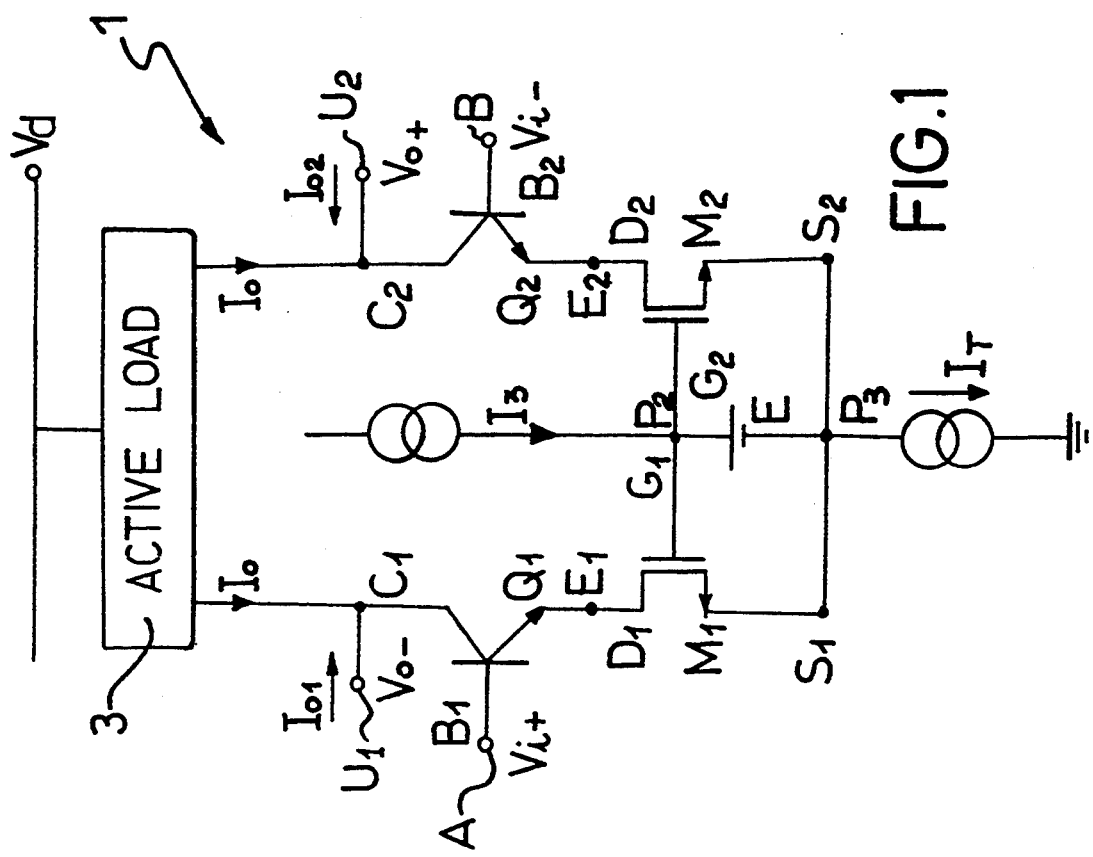
FIG. 1 is a schematic of the transconductor stage according to the invention.
FIG. 2 is a block diagram of the transconductor shown in FIG. 1.

FIG. 1 shows the schematic of the stage that is capable of handling high frequency signals (above 50 MHz). The stage 1 is realized in a mixed technology, including bipolar transistors as well as MOS-type transistors. This stage 1 contains an input circuit having signal inputs A and B and incorporating a transistor pair $M_1$, $M_2$ of the N-channel MOS type having their respective gate terminals $G_1$, $G_2$ connected into a node $P_2$. Node $P_2$ is supplied with a constant current $I_3$.

Transistors $M_1$, $M_2$ have their source terminals, $S_1$ and $S_2$, connected at node $P_3$. A constant voltage source E is placed between nodes $P_2$ and $P_3$, and a current generator ($I_T$) is provided between node $P_3$ and a point of constant potential. The voltage source E may be a battery, or a diode-connected N-channel field effect transistor through which the current $I_3$ is drawn. (E merely provides a voltage drop, and is not required to provide any power.) This voltage drop is selected to keep MOS transistors $M_1$, $M_2$ operating in the ohmic region.

The transconductor 1 also contains a second transistor pair $Q_1$, $Q_2$ which are of the bipolar npn junction type. $Q_1$ and $Q_2$ are identical.

The base terminal $B_1$ of transistor $Q_1$ is a non-inverting signal input A for the stage 1. The base terminal $B_2$ of transistor, $Q_2$, provides the inverting signal input B for the transconductor. Corresponding voltage signals Vi+ and Vi− are applied to the inputs A and B. The differential voltage Vin of stage 1 is defined as the difference (Vi+ minus Vi−) between the input signals.

Advantageously, each bipolar transistor, $Q_1$ and $Q_2$, is connected to its corresponding MOS transistor, $M_1$ and $M_2$. Specifically, the emitter $E_1$ of transistor $Q_1$ is connected to the drain terminal $D_1$ of the first MOS transistor $M_1$. Likewise, the emitter $E_2$ of transistor $Q_2$ is connected to the drain terminal $D_2$ of the second MOS transistor $M_2$.

The respective collectors $C_1$, $C_2$ of transistor pair $Q_1$, $Q_2$ are the outputs $U_1$, $U_2$ of the stage 1 through which differential currents $I_{o1}$ and $I_{o2}$ are drawn. An active load 3 is connected to collectors $C_1$, $C_2$ which supplies a current $I_o$ from a DC supply Vd.

A description of the operation of the transconductor stage according to this invention will now be given, followed by examples of its applications.

In a transconductor the output current should follow linearly from the input voltage. In order to have the stage 1 biased within the linear operation range of transistors $M_1$ and $M_2$, such that a proper linear voltage/current conversion can be achieved, a common mode DC voltage should be first established, e.g.:

$$Vi+ = Vi- = 2.5 \text{ Volts}.$$

The drop in the gate-source voltage Vgs of each of the MOS transistor pair $M_1$, $M_2$ is set by the generator E such that the transconductance of the stage 1 can be specially stable and unaffected by such external noise as common mode variations. Therefore, E is selected so that $M_1$, $M_2$ will operate in the ohmic region.

By an appropriate selection of the value for current Io, the drain-source voltage Vds drop of each MOS transistor, in the power-down state, can be the same and defined by the following relation.

$$Io = \mu Cox(W/L)[(E-Vth)^* Vds - Vds^2/2] \quad (1)$$

where $\mu$, Cox, W, and L are known parameters of the transistors, Vth is the threshold voltage, and the single unknown quantity is indeed voltage Vds.

Hence, it follows that the output current follows linearly the input voltage. The inputs at the bipolar transistors modulate Vds and therefore this modulates the output current linearly.

A typical value of this voltage Vds, effective to optimize the stage linearity, is on the order of 150–200 mV. Such a value also lowers the current draw without affecting the transconductance value. As for the bipolar transistors $Q_1$ and $Q_2$, these are directed to transfer the respective input signals Vi+ and Vi− on the drain terminals $D_1$, $D_2$. In addition, said bipolar transistors transfer the current generated by the transconductor stage to output.

For small input differential signals, the node $P_3$ is held at a constant voltage value.

The transconductance gm value is given by the ratio of the output current differential increment to the input voltage, namely:

$$gm = \delta Io/\delta Vin = \mu Cox (W/L)[E-Vth-Vds] \quad (2)$$

This equation (2) only holds for small differential signals. In the presence of wide signals, the voltage at the node $P_3$ would be no longer constant, and the transistors $Q_1$, $Q_2$ would be unable to fully transfer the input signal on the drain terminals $D_1$ and $D_2$. This obviously results in the output signal being distorted.

By appropriate selection of the value of Vds, the linear operation conditions of the stage 1 can be predetermined.

As an example:

1) with Vds=150 mV, distortion is less than 1% for input signals characterized by a peak-to-peak range below 0.5 Volts;
2) with Vds=300 mV, distortion is less than 1% for input signals characterized by a peak-to-peak range below 1 Volt.

The transconductor stage of this invention can be optimized to fulfill a specific application demand both in terms of linearity and of transconductance gm value and current draw. It should be noted that this provides a high degree of flexibility in use.

Since the frequency limitation of stage 1 is tied solely to the bipolar transistors $Q_1$, $Q_2$, it is preferable that these transistors have a low base resistance and high transition frequency. Further, the product of the collector resistance by the collector-substrate capacitance must preferably be quite small, because it represents a so-called pole for the output current.

In a sample contemplated embodiment, W/L values for M1 and M2 are 20/2 μm, with a Vt of 0.8 V, and the bipolar input transistors are given a base current bias of 3 μA. The voltage source E is implemented with a simple diode-connected NMOS transistor (W/L=10/3 μm) in series with a 10 kΩ resistance. The value of E is selected to exceed Vt by an amount (the overdrive voltage Vov) which is between 1 and 2 V for Vds=150 mV. (However, for Vds=300 mV, Vov must remain below 0.7 V.) However, of course, a wide variety of other specific values can be used (as will be readily apparent to those skilled in the art).

An application of the transconductor stage according to the invention will now be described.

In FIG. 2, the stage 1 is shown in a schematic form illustrating only inputs and outputs.

Figure 3:
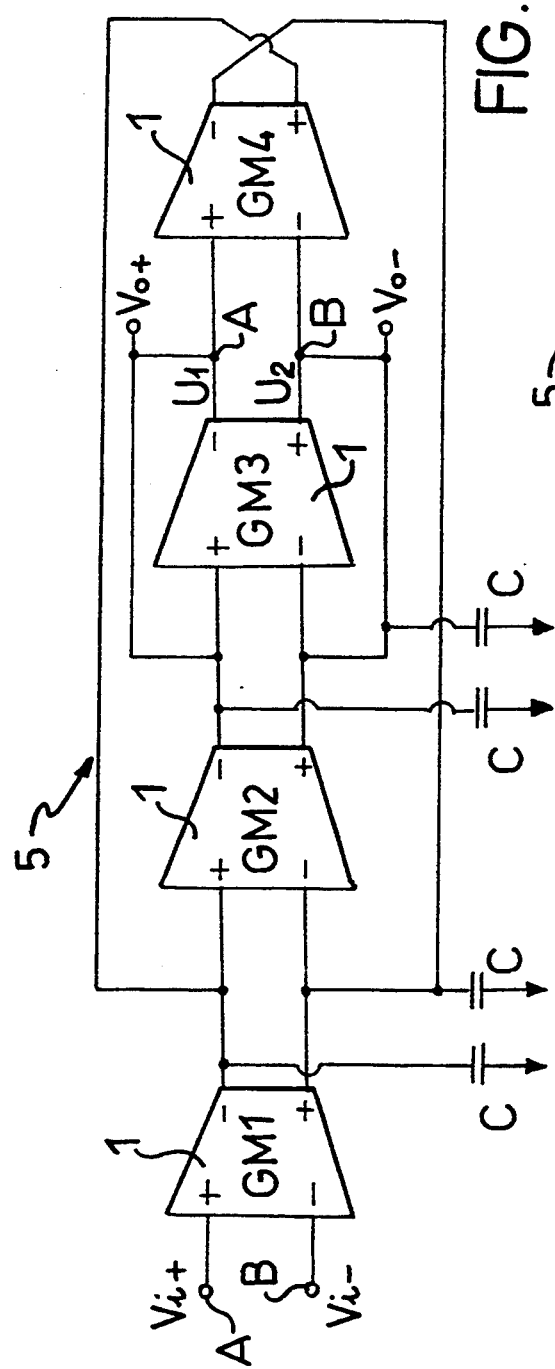
FIGS. 3 and 4 are respective schematic diagrams of possible embodiments of continuous-time filters incorporating the novel transconductor stage.

FIG. 3 shows, based on the diagram of FIG. 2, an embodiment of the continuous-time low-pass filter 5 which incorporates several transconductor differential stages according to the invention, referenced GM1, GM2, GM3 and GM4.

The filter 5 may be monolithically integrated and is designed especially for very high-frequency (in excess of 50 MHz) applications.

The filter may comprise a so-called biquadratic cell. The stages 1 are connected together in cascade arrangement with the outputs $U_1$, $U_2$ of one stage being connected to the respective inputs A, B of the next stage.

Conveniently, the fourth stage outputs are feedback-connected in a crossed fashion to the inputs of the second stage, whilst the third stage outputs are feedback-connected to the inputs of the third stage.

Also provided are capacitive couplings between the outputs of the first two stages and ground.

The filter 5 shown is specially effective where the dynamic range of the input signal is less than 200 mV peak-to-peak.

With higher dynamic ranges than this value, it is convenient to introduce buffer circuits 4 to prevent distortion of the signal.

Figure 4:
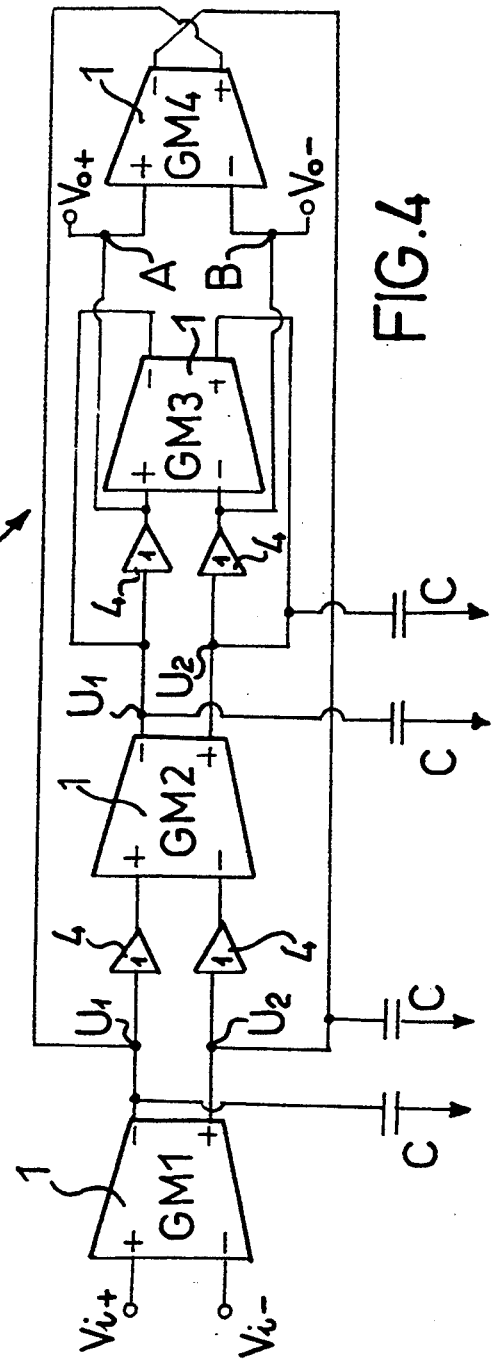

Shown in FIG. 4 is an application where the filter 5 has unity gain, buffer circuits incorporated before the signal inputs of the second and third filter stages.

The transconductor stage of this invention does solve the technical problem. Its transconductance value is approximately three times as high as other solutions. This enables handling of very high frequency signals, even in excess of 50 Mhz.

Further Modifications and Variations

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. An integrated circuit transconductor stage, comprising:
   first and second circuit branches, each including a bipolar transistor and a field-effect transistor in series, said bipolar transistors having bases thereof connected to provide complementary inputs for said transconductor, and said field-effect transistors having gates thereof connected together, and said field-effect transistors having source terminals thereof connected together; and
   a bias circuit connected to provide a constant bias voltage to said gates, said bias voltage having a value which keeps said field-effect transistors operating in a substantially ohmic regime, and
   wherein at least one of said branches is connected to provide output for said transconductor stage.

2. The integrated circuit of claim 1, further comprising a constant current source connected between said source terminals and a constant lower potential.

3. The integrated circuit of claim 1, wherein said field-effect transistors are N-channel, and said bipolar transistors are NPN.

4. The integrated circuit of claim 1, wherein collectors of bipolar transistors are connected to provide outputs.

5. The integrated circuit of claim 1, wherein said bias circuitry comprises a nonlinear load element connected between said sources and said gates, and an additional current source connected to provide a constant current through said nonlinear load element.

6. The integrated circuit of claim 1, wherein said complementary inputs are biased with a constant common-mode voltage which is greater than the threshold voltage of said field-effect transistor plus one diode drop.

7. An integrated circuit, comprising:
   first and second circuit branches, each including a bipolar transistor and a field-effect transistor in series, said bipolar transistors having bases thereof connected to provide complementary inputs for said transconductor, said field-effect transistors having gates thereof connected together, and said field-effect transistors having sources thereof connected together;
   bias circuitry connected to provide a constant bias voltage to said gates, said bias voltage having a value which keeps said field-effect transistors operating in a substantially ohmic regime;
   a first current source connected to provide a substantially constant current to said sources; and a load connected to provide two current outputs with equal source impedances, opposite in polarity to said first current source, separately to said bipolar transistors.

8. The integrated circuit of claim 7, wherein said field-effect transistors are N-channel, and said bipolar transistors are NPN.

9. The integrated circuit of claim 7, wherein collectors of bipolar transistors are connected to provide outputs.

10. The integrated circuit of claim 7, wherein said bias circuitry comprises a nonlinear load element connected between said sources and said gates, and an additional current source connected to provide a constant current through said nonlinear load element.

11. The integrated circuit of claim 7, wherein said complementary inputs are biased with a constant common-mode voltage which is greater than the threshold voltage of said field-effect transistor plus one diode drop.

12. An integrated circuit, comprising:
  first and second circuit branches, each including a bipolar transistor and a field-effect transistor in series, said bipolar transistors having bases thereof connected to provide complementary inputs for said transconductor and connected to be driven by equal bias currents, said field-effect transistors having gates thereof connected together, and said field-effect transistors having sources thereof connected together; and
  bias circuitry connected to provide a constant bias voltage to said gates, said bias voltage having a value which keeps said field-effect transistors operating in a substantially ohmic regime;
  a first current source connected to provide a substantially constant first bias current to said sources;
  a load connected to provide two current outputs with equal source impedances, opposite in polarity to said first current source, separately to said bipolar transistors.

13. The integrated circuit of claim 12, wherein said field-effect transistors are N-channel, and said bipolar transistors are NPN.

14. The integrated circuit of claim 12, wherein collectors of bipolar transistors are connected to provide outputs.

15. The integrated circuit of claim 12, wherein said bias circuitry comprises a nonlinear load element connected between said sources and said gates, and an additional current source connected to provide a constant current through said nonlinear load element.

16. The integrated circuit of claim 12, wherein said complementary inputs are biased with a constant common-mode voltage which is greater than the threshold voltage of said field-effect transistor plus one diode drop.

17. A transconductor stage for high-frequency filters, comprising
  an input circuit portion having signal inputs, and
  an output circuit portion operatively connected to be driven by said input portion, and
  a pair of field-effect transistors having respective gate and source terminals in common and wherein a constant voltage generator is provided between said common gate and source terminals,
  wherein said output portion comprises a pair of bipolar transistors connected to said field-effect transistors.

18. A transconductor stage according to claim 17, wherein said signal inputs are the respective bases of said bipolar transistors.

19. A transconductor stage according to claim 17, wherein said bipolar transistors are of the npn junction type.

20. A transconductor stage according to claim 17, wherein each of said bipolar transistors has its respective emitter connected to a corresponding one of the drain terminals of the other pair of field-effect transistors.

21. A transconductor stage according to claim 17, wherein said bipolar transistors are the same size.

22. A transconductor stage according to claim 17, wherein, for said field-effect transistors the drain-source voltage drop value is predetermined by the type of the application for which the stage is intended.

23. A transconductor stage according to claim 17, wherein the respective collectors of said bipolar transistors are the stage outputs.

24. A transconductor stage according to claim 17, wherein said field-effect transistors are of the MOS type.

25. A low-pass filter of the second order, including at least one transconductor differential stage and at least one capacitor said transconductor stage, comprising
  an input circuit portion having signal inputs, and
  an output circuit portion operatively connected to be driven by said input portion, and
  a pair of field-effect transistors having respective gate and source terminals in common and wherein a constant voltage generator is provided between said common gate and source terminals,
  wherein said output portion comprises a pair of bipolar transistors connected to said field-effect transistors.

26. A continuous-time integrated circuit filter including at least one transconductor differential stage and at least one capacitor said transconductor stage, comprising:
  first and second circuit branches, each including a bipolar transistor and a field-effect transistor in series, said bipolar transistors having bases thereof connected to provide complementary inputs for said transconductor, and said field-effect transistors having gates thereof connected together, and said field-effect transistors having source terminals thereof connected together; and
  a bias circuit connected to provide a constant bias voltage to said gates, said bias voltage having a value which keeps said field-effect transistors operating in a substantially ohmic regime, and
  wherein at least one of said branches is connected to provide output for said transconductor stage.

27. A method of operating a transconductor stage, comprising the steps of:
  (a.) providing complementary inputs to bases of first and second matched bipolar transistors, said transistors having second terminals thereof connected to two matched loads; while
  (b.) performing voltage-to-current conversion at a third terminal of each said bipolar transistor, using two field-effect transistors each connected to said third terminal of a respective one of said bipolar transistors; while
  (c.) providing a constant and equal gate bias voltages to both said field-effect transistors; while
  (d.) providing a constant bias current to a second source/drain terminal of both said field-effect transistors, said second source/drain terminals of both said field-effect transistors being connected in common.

* * * * *